United States Patent [19]

Meldner et al.

[11] Patent Number: 4,626,791
[45] Date of Patent: Dec. 2, 1986

[54] MICROWAVE DETECTOR

[75] Inventors: Heiner W. Meldner, Moss Beach, Calif.; Ronald Y. Cusson, Chapel Hill, N.C.; Ray M. Johnson, San Ramon, Calif.

[73] Assignee: The United States of America as represented by the United States Department of Energy, Washington, D.C.

[21] Appl. No.: 699,879

[22] Filed: Feb. 8, 1985

[51] Int. Cl.$^4$ .............................................. H03K 9/02
[52] U.S. Cl. .................................... 329/109; 307/350; 328/150; 329/160; 329/200; 375/24; 375/94
[58] Field of Search ........................ 307/350; 328/150; 329/104, 105, 107, 109, 146, 160, 161, 162, 200; 375/22, 23, 24, 94; 455/337

[56] References Cited

U.S. PATENT DOCUMENTS 4,271,411  6/1981  Takashi .......................... 329/161 X

OTHER PUBLICATIONS

Cusson et al., "The Ḃ Detector: Method of Operation", Lawrence Livermore National Lab Doc. UCID-20093, 5-1984.
Jaffe et al., "Ferrite Microwave Detector", Proceedings of the IRE, vol. 46, pp. 594–601 (1958).

Primary Examiner—Eugene R. LaRoche
Assistant Examiner—James C. Lee
Attorney, Agent, or Firm—Gary C. Roth; Clifton E. Clouse, Jr.; Judson R. Hightower

[57] ABSTRACT

A microwave detector (10) is provided for measuring the envelope shape of a microwave pulse comprised of high-frequency oscillations. A biased ferrite (26, 28) produces a magnetization field flux that links a B-dot loop (16, 20). The magnetic field of the microwave pulse participates in the formation of the magnetization field flux. High-frequency insensitive means (18, 22) are provided for measuring electric voltage or current induced in the B-dot loop. The recorded output of the detector is proportional to the time derivative of the square of the envelope shape of the microwave pulse.

7 Claims, 3 Drawing Figures

MICROWAVE DETECTOR

BACKGROUND OF THE INVENTION

The U.S. Government has rights in this invention pursuant to Contract No. W-7405-ENG-48 between the U.S. Department of Energy and the University of California for the operation of Lawrence Livermore National Laboratory.

The invention described herein relates generally to microwave detectors, and more particularly to detectors for measuring high-frequency component microwave pulses.

There exist many detectors and detector systems for measuring the frequency and power of most ordinary microwave signals. These known detectors and systems are described in many textbooks, one of which is "Handbook of Microwave Measurements, Third Edition (1963)" by M. Sucher and J. Fox, published by the Polytechnic Press of the Polytechnic Institute of Brooklyn, which is hereby incorporated by reference herein.

Some microwave devices contain ferrites. Ferrites are magnetic materials that are described in many textbooks, one of which is "Principles of Microwave Ferrite Engineering (1969)" by J. Helszajn, published by Wiley-Interscience, which is hereby incorporated by reference herein.

A ferrite microwave detector is described by Jaffe et al in Proceedings of the IRE, vol. 46, pages 594 to 601, 1958. In this mechanical-type detector, the demodulated envelope of an amplitude-modulated microwave signal is used to magnetostrict a long thin ferrite rod. The mechanical vibration of the ferrite rod is observed by means of a ferroelectric transducer bonded to the end of the ferrite rod or by a coil wound around the ferrite rod.

A very well known and much used microwave detector is the B-dot sensor. In essence, this detector simply comprises a conducting metal loop disposed within the microwave signal environment so that the integrated magnetic field passing through the loop changes with time and induces an electrical signal which is recorded by means usually involving a cable system coupled to both the conducting loop and an oscilloscope. A balanced output may be achieved by adding a second B-dot sensor in the opposite orientation from the first, and by using a balun circuit for the difference signal to eliminate common spurious signals in the usual way. Thus the word dot in the name of this detector refers to the time derivative of the magnetic field B. The B-dot detector is ineffective at microwave frequencies above about 3 GHz, because the cable response characteristics of the recording system preclude the transmission of such high frequency signals, which average to zero over time, to the recording oscilloscope. If the B-dot detector is used in attempting to measure a microwave pulse comprised of such high frequency microwave oscillations, the recording oscilloscope will not display any measured trace. In this situation it would be very beneficial to be able to measure the shape of the pulse envelope of the high-frequency oscillations actually comprising the pulse.

Semiconductor type microwave detectors do exist which can record very high frequency microwave oscillations. However, these detectors are extremely sensitive and delicate, and they often require a primary signal attenuation of many orders of magnitude which makes their calibration very difficult. These semiconductor type detectors, furthermore, can burn out when subjected to merely a few watts of extraneous electromagnetic-pulse power. Another disadvantage of these semiconductor type microwave detectors is that they produce very small output voltages and thus often require amplifiers. These amplifiers, also, are very sensitive to small extraneous pulses of electromagnetic power and can easily burn out.

SUMMARY OF THE INVENTION

It is therefore an object of the invention to provide a microwave detector capable of measuring the shape of the pulse envelope of a microwave pulse comprised of high-frequency oscillations.

Another object of the invention is to provide a microwave detector that is capable of directly measuring high-power microwave pulses without requiring signal attenuation.

Yet another object of the invention is to provide a microwave detector that is rugged and not subject to burn out from extraneous electromagnetic-pulse power.

A further object of the invention is to provide a microwave detector that produces a large output signal that does not require amplification.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purposes of the present invention, as embodied and broadly described herein, the microwave detector of this invention may comprise a biased ferrite positioned within a B-dot loop. The magnetization field flux of the biased ferrite, which links the B-dot loop, is caused in part by the magnetic field of the microwave pulse, comprised of high-frequency oscillations, that is being measured. When the electrical voltage or current induced in the B-dot loop is recorded by a detection means that is high-frequency insensitive, such as by a coaxial cable and oscilloscope recording system, the signal recorded is proportional to the time rate of change of the square of the microwave pulse envelope. The microwave pulse envelope itself can be obtained from this recorded signal.

In the often encountered situation wherein the microwave pulse is propagating along a waveguide, the detector may comprise a cavity opening off from a sidewall of the waveguide. The cavity is disposed so that the electromagnetic fields of the microwave pulse can easily enter and exit the cavity. The cavity itself forms part of a B-dot loop that provides a closed conducting path about the interior of the cavity. Thus the magnetic field flux of the microwave pulse links the B-dot loop. The magnetization field flux of a biased ferrite that is positioned within the cavity also links the B-dot loop. This magnetization field flux is caused in part by the magnetic field of the microwave pulse. This detector shares the high-power handling, ruggedness, and large signal output characteristics of the standard B-dot loop sensor.

Preferably, the ferrite component of the detector is a high frequency ferrite.

It is also preferred that the ferrite component of the detector be biased in the range from 0.5 to 0.7 of saturation.

It is frequently preferred to provide the microwave detector with a second B-dot loop oriented in the opposite direction from the first B-dot loop. In this embodiment it is preferred to use a balun circuit to jointly process the two induced electric voltages or currents from the two B-dot loops and thereby eliminate common spurious signals.

The benefits and advantages of the present invention, as embodied and broadly described herein, include, inter alia, the provision of a microwave detector that is capable of measuring the shape of the pulse envelope of a microwave pulse comprised of high-frequency oscillations. The detector can directly accommodate high-power microwave pulses without requiring signal attenuation. The rugged detector is not subject to burn out from extraneous pulses of electromagnetic power. the detector provides a large signal output that does not require amplification.

BRIEF DESCRIPTION OF THE DRAWINGS

The accompanying drawings, which are incorporated in and form a part of the specification, illustrate an embodiment of the invention and, together with the description, serve to explain the principles of the invention. In the drawings.

DETAILED DESCRIPTION OF THE INVENTION

Figure 1:
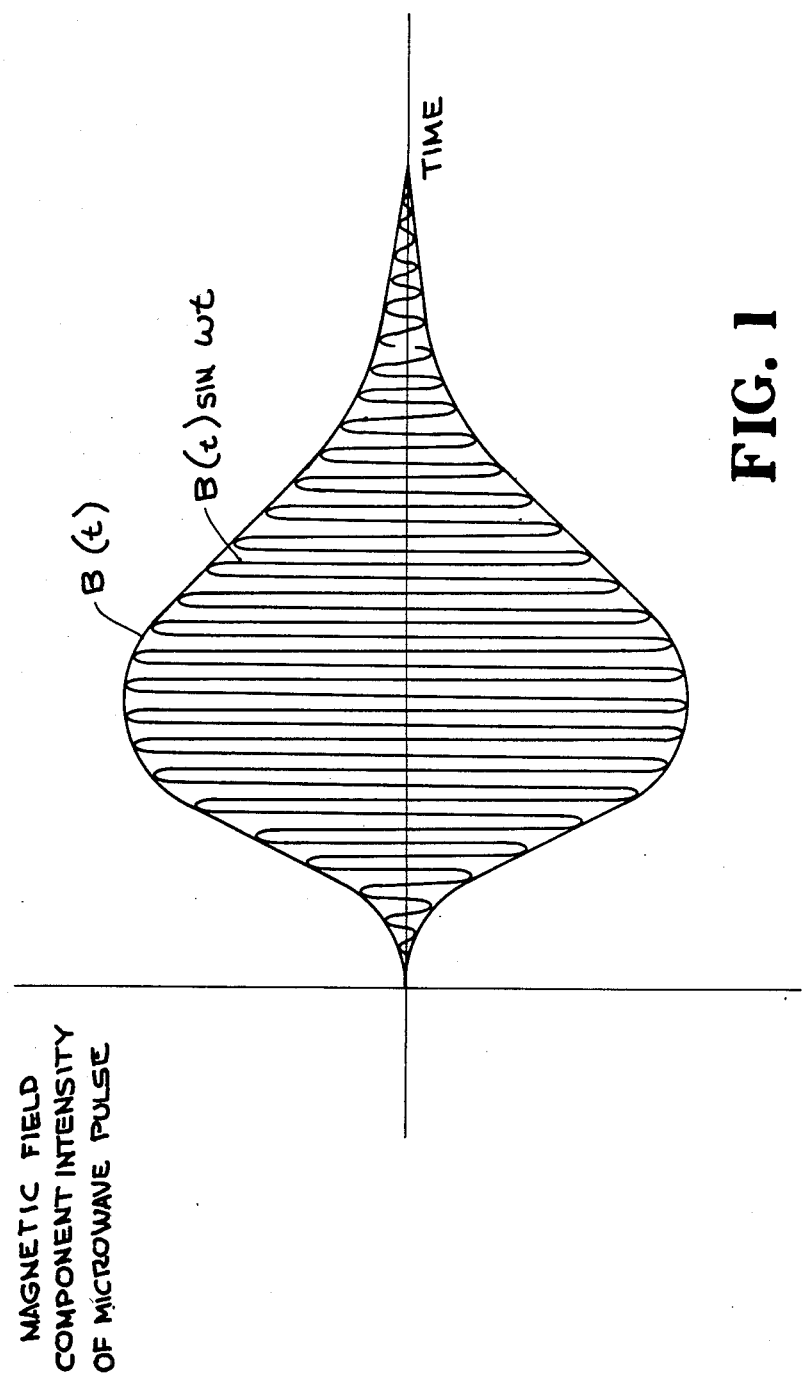
FIG. 1 is a graph showing a typical component of magnetic field intensity vs. time, for a mirowave pulse comprised of high-frequency oscillations that has a pulse envelope exemplary of those whose shape can be measured by the microwave detector of this invention.

Reference will now be made in detail to the present preferred embodiment of the invention, an example of which is illustrated in the accompanying drawings. Reference is first made to FIG. 1 which shows a typical component of magnetic field intensity of a microwave pulse comprised of high-frequency oscillations. The shape of the pulse may be expressed mathematically as $B(t) \sin \omega t$, where t is time, $B(t)$ is the pulse envelope shape, and $\omega$ is the angular frequency of the high-frequency oscillations comprising the pulse.

Figure 2:
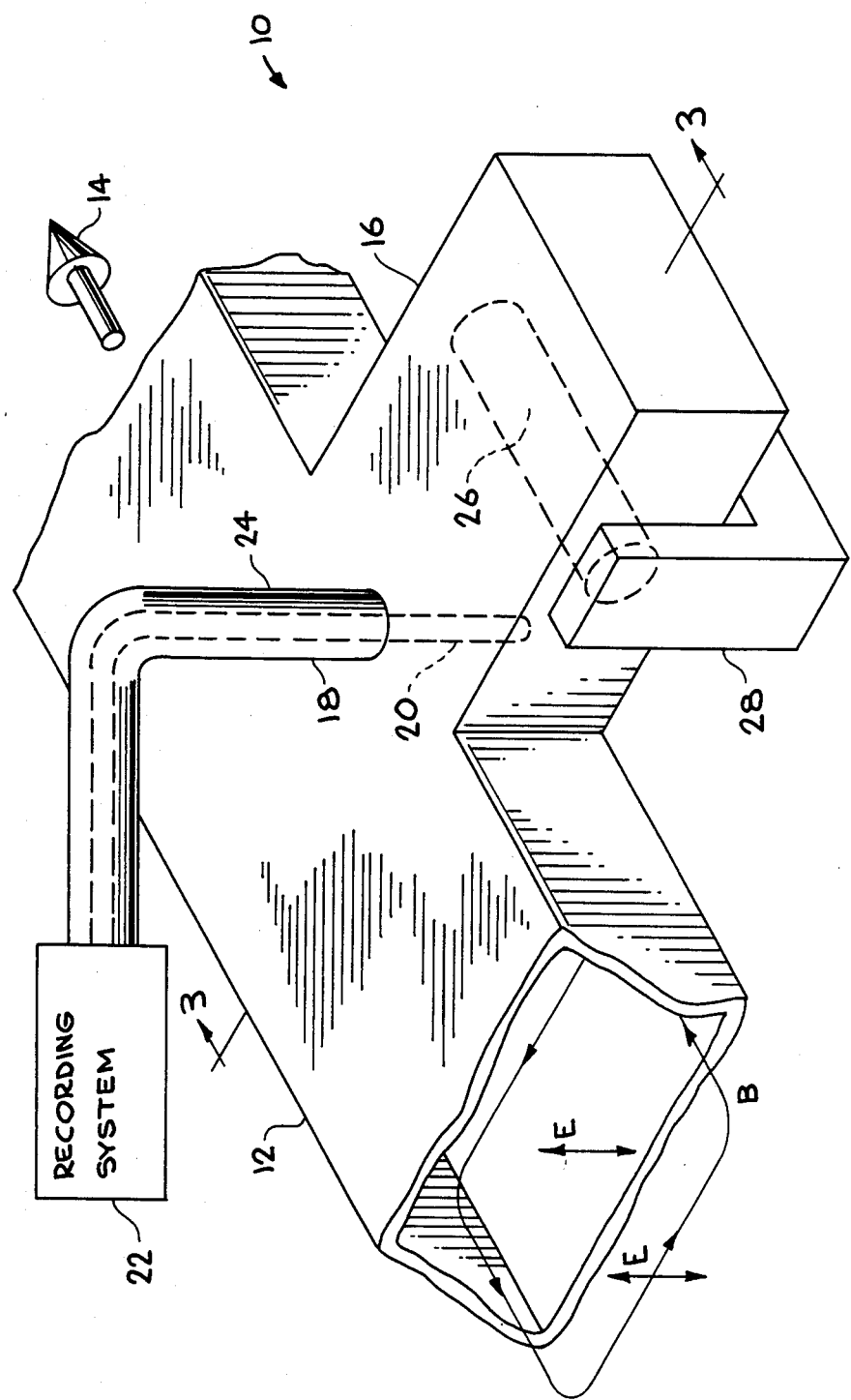
FIG. 2 is a perspective view of a microwave detector made in accordance with the invention.
Figure 3:
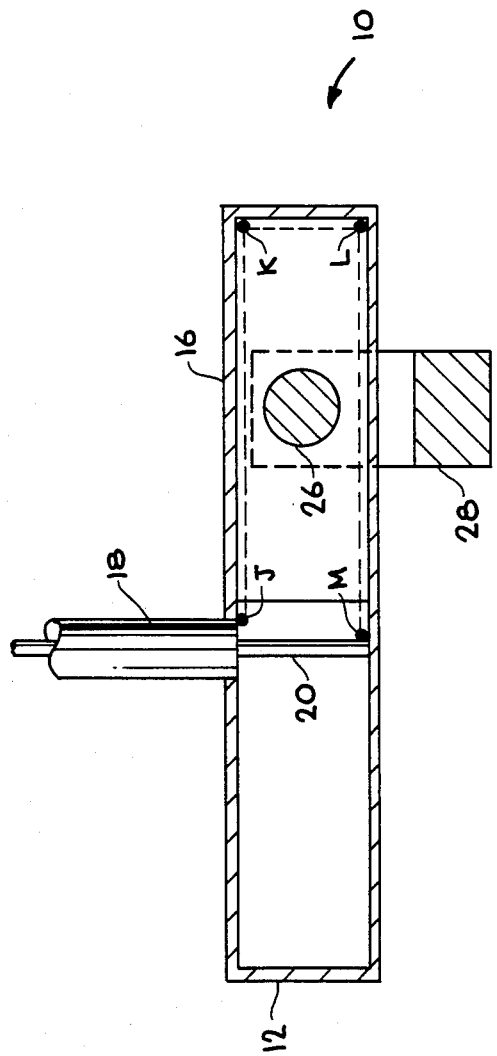
FIG. 3 is a sectional side view of the microwave detector of FIG. 2, taken generally along line 3—3 in FIG. 2.

Reference is now made concurrently to FIGS. 2 and 3 which show a perspective and a side view, respectively, of a microwave detector 10 made in accordance with the invention. A waveguide 12 is shown carrying microwave pulse power in the direction indicated by arrow 14, although the detector will function with microwave power being carried in either direction. The magnetic and electric field components, B and E, of a typical microwave mode, such as the TEM mode, are schematically indicated. Microwave cavity 16 opens off from a sidewall of waveguide 12. Ingress and egress for the electromagnetic fields of the microwave pulse is freely permitted by the geometry shown.

Coaxial cable 18 with center conductor 20 leads to Recording System 22, which is schematically indicated. As shown, the outer conductor 24 of coaxial cable 18 is attached to the top of waveguide 12, with center conductor 20 extending across waveguide 12 and attached to the bottom of waveguide 12. In this manner a B-dot loop is established providing a closed conducting path about the interior of cavity 16 generally along the path JKLM. Path JKLM is linked by the magnetic field flux of the microwave pulse, and is completely closed by coaxial cable 18 and Recording System 22. Although coaxial cable 18 is shown attached to waveguide 12, in other embodiments of the invention the points of attachment may be efficaciously moved slightly so as to be within microwave cavity 16.

Ferrite 26 is positioned within microwave cavity 16. Preferably ferrite 26 is a high frequency ferrite. Ferrite 26 is magnetically biased by magnet 28. Preferably ferrite 26 is biased in the range of from 0.5 to 0.7 of saturation. Ferrites, such as ferrite 26, and biasing magnets, such as magnets 28, are very well known in the art of microwave engineering.

Biased ferrite 26 produces a magnetization field flux that links B-dot loop JKLM. The magnetic field of the microwave pulse participates in the formation of the magnetization field flux of biased ferrite 26. The magnetic flux intensity components linking B-dot loop JKLM vary at the frequency $\omega$ or higher. If $\omega$ corresponds to about 3 GHz or above, most of these high-frequency varying magnetic flux intensity components induce electric voltages or currents in B-dot loop JKLM which average to zero and cannot be recorded by Recording System 22 because of the relatively sluggish signal response characteristics of coaxial cable 18 and Recording System 22. However, for detector 10 shown in FIG. 2, one component of magnetic flux intensity linking B-dot loop JKLM varies as $B^2(t) \cos^2 \omega t$. This time-varying flux induces an electric voltage or current in B-dot loop JKLM that is proportional to $\cos^2 \omega t \, d/dt[B^2(t)]$. In this situation, since $\cos^2 \omega t$ averaged over time is not zero but rather is one-half, this electric voltage or current when recorded by Recording System 22 produces a recorded signal that varies as $d/dt[B^2(t)]$, the time derivative of the envelope shape squared of the microwave pulse. This recorded signal data can be easily unfolded to yield $B(t)$. The inventors sometimes call their detector the B-square dot detector. The output of the detector 10 is also functional of the magnetic characteristics of ferrite 26.

The well-knwon B-dot detector is often provided with a second B-dot loop oriented in the opposite direction from the first B-dot loop. In this configuration the well-known balun circuit is employed to jointly process the two induced electric voltages or currents from the two B-dot loops. This technique eliminates common spurious signals from the finally recorded detector output. It is similarly sometimes preferred to use a second oppositely oriented B-dot loop and a balun circuit, for the same purpose of eliminating common spurious signals from the finally recorded detector output, in the present invention.

It is thus appreciated that in accordance with the invention as herein described and shown in FIGS. 2 and 3, a microwave detector is provided that is capable of measuring the shape of the pulse envelope of a microwave pulse comprised of high-frequency oscillations. The detector can directly accommodate high-power microwave pulses without requiring signal attenuation. The detector is rugged and not subject to burn out from extraneous pulses of electromagnetic power. The detector provides a large signal output that does not require amplification.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A detector for measuring the envelope shape of a microwave pulse comprised of high-frequency oscillations, said detector comprising:
   a B-dot loop linking the magnetic field of said microwave pulse;
   a biased ferrite, that produces a magnetization field flux that links said B-dot loop, and that is positioned within said B-dot loop so that the magnetic field of said microwave pulse interacts with said ferrite and thereby participates in the formation of said magnetization field flux; and
   high-frequency insensitive means for measuring electric voltage or current induced in said B-dot loop.

2. A method of measuring the envelope shape of a microwave pulse comprised of high-frequency oscillations, said method comprising the steps of:
   linking a B-dot loop with the magnetic field of said microwave pulse and with the magnetization field flux of a biased ferrite;
   positioning said ferrite within said B-dot loop so that the magnetic field of said microwave pulse interacts with said ferrite and thereby participates in the formation of said magnetization field flux; and
   measuring electric voltage or current induced in said B-dot loop by means that are high-frequency insensitive.

3. A detector for measuring the envelope shape of a microwave pulse comprised of high-frequency oscillations and propagating along a waveguide, said detector comprising:
   a cavity opening off from a sidewall of said waveguide, and permitting free ingress and egress therein for the electromagnetic fields of said microwave pulse;
   a B-dot loop providing a closed conducting path about the interior of said cavity, with said path linked by magnetic field flux of said microwave pulse;
   a biased ferrite positioned within the conducting path of said B-dot loop about the interior of said cavity, that produces a magnetization field flux that links said B-dot loop, so that the magnetic field of said microwave pulse interacts with said ferrite and thereby participates in the formation of said magnetization field flux; and
   high-frequency insensitive means for measuring electric voltage or current induced in said B-dot loop.

4. A detector, as recited in claim 3, in which said ferrite is a high frequency ferrite.

5. A detector, as recited in claim 3, in which said biased ferrite is biased in the range of from 0.5 to 0.7 of saturation.

6. A detector, as recited in claim 3, further comprising a second B-dot loop oriented in the opposite direction from the first B-dot loop.

7. A detector, as recited in claim 6, further comprising a balun circuit for jointly processing the electric voltages or currents from the first and second B-dot loops and thereby eliminating common spurious signals.

* * * * *